United States Patent
Höppel et al.

(10) Patent No.: US 8,698,178 B2
(45) Date of Patent: Apr. 15, 2014

(54) OPTOELECTRONIC SEMICONDUCTOR COMPONENT AND METHOD FOR PRODUCING AN INORGANIC OPTOELECTRONIC SEMICONDUCTOR COMPONENT

(75) Inventors: Lutz Höppel, Alteglofsheim (DE); Norwin von Malm, Nittendorf-Thumhausen (DE)

(73) Assignee: OSRAM Opto Semiconductors GmbH (DE)

( * ) Notice: Subject to any disclaimer, the term of this patent is extended or adjusted under 35 U.S.C. 154(b) by 24 days.

(21) Appl. No.: 13/318,800

(22) PCT Filed: Jun. 10, 2010

(86) PCT No.: PCT/EP2010/058160
§ 371 (c)(1),
(2), (4) Date: Nov. 15, 2011

(87) PCT Pub. No.: WO2011/006719
PCT Pub. Date: Jan. 20, 2011

(65) Prior Publication Data
US 2012/0098016 A1    Apr. 26, 2012

(30) Foreign Application Priority Data
Jul. 17, 2009  (DE) .......................... 10 2009 033 686

(51) Int. Cl.
*H01L 33/52* (2010.01)
(52) U.S. Cl.
USPC ............... 257/98; 257/E33.068; 257/E33.059
(58) Field of Classification Search
CPC .............................. H01L 25/167; H01L 27/14
USPC ............................................................. 257/98
See application file for complete search history.

(56) References Cited

U.S. PATENT DOCUMENTS

| 4,058,430 | A | 11/1977 | Suntola et al. |
| 7,622,746 | B1 | 11/2009 | Lester et al. |
| 2005/0211993 | A1 | 9/2005 | Sano et al. |
| 2007/0114552 | A1 | 5/2007 | Jang et al. |
| 2008/0113462 | A1 | 5/2008 | Kim et al. |
| 2009/0101919 | A1* | 4/2009 | Yao ................................. 257/85 |
| 2009/0242918 | A1* | 10/2009 | Edmond et al. ................. 257/98 |

(Continued)

FOREIGN PATENT DOCUMENTS

| DE | 10 2007 004 304 | 7/2008 |
| DE | 10 2007 022 947 | 10/2008 |

(Continued)

OTHER PUBLICATIONS

Hamatsu Photonics KK, JP 2008-305922 Machine Translation, Mar. 11, 2013.*

(Continued)

*Primary Examiner* — Mamadou Diallo
(74) *Attorney, Agent, or Firm* — DLA Piper LLP (US)

(57) ABSTRACT

An optoelectronic semiconductor component includes a carrier and at least one semiconductor layer sequence. The semiconductor layer sequence includes at least one active layer. The semiconductor layer sequence is furthermore mounted on the carrier. The semiconductor component furthermore includes a metal mirror located between the carrier and the semiconductor layer sequence. The carrier and the semiconductor layer sequence project laterally beyond the metal mirror. The metal mirror is laterally surrounded by a radiation-transmissive encapsulation layer.

17 Claims, 4 Drawing Sheets

(56) References Cited

U.S. PATENT DOCUMENTS

| | | | |
|---|---|---|---|
| 2009/0294784 A1* | 12/2009 | Nakahara et al. | 257/98 |
| 2010/0008391 A1 | 1/2010 | Nakagawa et al. | |
| 2010/0072500 A1 | 3/2010 | Herrmann | |
| 2010/0171135 A1 | 7/2010 | Engl et al. | |
| 2010/0208763 A1 | 8/2010 | Engl et al. | |

FOREIGN PATENT DOCUMENTS

| | | |
|---|---|---|
| DE | 10 2007 029 370 | 11/2008 |
| EP | 2 063 468 | 5/2009 |
| JP | 5-235406 | 9/1993 |
| JP | 2004-214084 | 7/2004 |
| JP | 2004-281863 | 10/2004 |
| JP | 2006-100500 | 4/2006 |
| JP | 2007-512154 | 5/2007 |
| JP | 2007-142368 | 6/2007 |
| JP | 2007-273590 | 10/2007 |
| JP | 2008-305922 * | 12/2008 |
| WO | 2008/045886 | 4/2008 |
| WO | 2009/045082 | 4/2009 |
| WO | 2009/084670 A1 | 7/2009 |

OTHER PUBLICATIONS

Japanese Office Action dated Dec. 17, 2013 for Japanese Patent Application No. 2012-519952.

* cited by examiner

OPTOELECTRONIC SEMICONDUCTOR COMPONENT AND METHOD FOR PRODUCING AN INORGANIC OPTOELECTRONIC SEMICONDUCTOR COMPONENT

RELATED APPLICATIONS

This is a §371 of International Application No. PCT/EP2010/058160, with an international filing date of Jun. 10, 2010 (WO 2011/006719, published Jan. 20, 2011), which is based on German Patent Application No. 10 2009 033 686.9, filed Jul. 17, 2009, the subject matter of which is incorporated by reference.

TECHNICAL FIELD

This disclosure relates to an optoelectronic semiconductor and a method for producing an inorganic optoelectronic semiconductor component.

BACKGROUND

It could be helpful to provide an optoelectronic semiconductor component having elevated light outcoupling efficiency and a method for producing such an optoelectronic semiconductor component.

SUMMARY

We provide an optoelectronic semiconductor component including a carrier, at least one semiconductor layer sequence mounted on the carrier and having at least one active layer, and a metal mirror located between the carrier and the semiconductor layer sequence, wherein the carrier and the semiconductor layer sequence project beyond the metal mirror in a lateral direction and the metal mirror is laterally surrounded by an encapsulation layer.

We also provide a method for producing an inorganic optoelectronic semiconductor component including providing a carrier, a semiconductor layer sequence and a metal mirror located between the carrier and the semiconductor layer sequence and laterally overhung by the metal mirror, and applying by atomic layer deposition an encapsulation layer in a lateral direction on the metal mirror.

We further provide an optoelectronic semiconductor component including a carrier, at least one semiconductor layer sequence mounted on the carrier and having at least one active layer, and a metal mirror between the carrier and the semiconductor layer sequence, wherein the carrier and the semiconductor layer sequence project beyond the metal mirror in a lateral direction and the metal mirror is laterally surrounded by an encapsulation layer, and wherein the encapsulation layer, alone or together with an optional connection zone for a bonding wire, completely cover flanks of the semiconductor layer sequence and a radiation passage face of the semiconductor layer sequence.

DETAILED DESCRIPTION

Figure 1A:
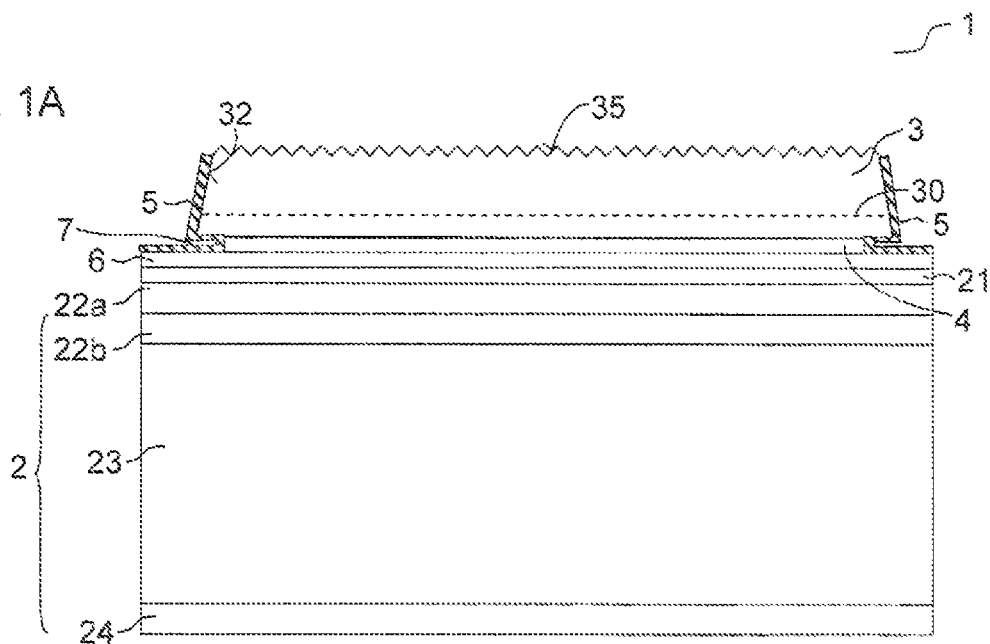
FIGS. 1A, 1B, 2 and 4 to 7 are schematic sectional representations of examples of our optoelectronic semiconductor components.

The optoelectronic semiconductor component may include at least one semiconductor layer sequence. The preferred inorganic semiconductor layer sequence may comprise a light-emitting diode, a laser diode or a photodiode. The semiconductor layer sequence is preferably a thin-film layer sequence, as for example stated in document DE 10 2007 004 304 A1, the subject matter of which relating to the semiconductor layer sequence and the production method described therein is incorporated by reference. The semiconductor layer sequence includes one or more active layers. Active means that the corresponding layer is designed to emit or to absorb electromagnetic radiation.

The optoelectronic semiconductor component may comprise a carrier. The carrier is preferably designed to carry the semiconductor layer sequence and support it mechanically. The carrier in particular comprises a rigid solid which is flexurally stable when exposed to the stresses which arise during intended operation of the semiconductor component. For example, the carrier comprises or consists of a semiconductor material such as germanium or silicon, a metal such as Cu, Ni, Ag or Mo or an electrically insulating material such as $Al_2O_3$, AlN or $SiN_x$. The carrier may differ from a growth substrate of the semiconductor layer sequence.

The semiconductor layer sequence may be mounted on the carrier. This may mean that one or more layers are located between the semiconductor layer sequence and the carrier, which ensure adhesion and a firm connection between the semiconductor layer sequence and the carrier. In particular, there is no direct contact between a material of the carrier and the semiconductor layer sequence.

The optoelectronic semiconductor component may comprise a metal mirror. The metal mirror is located between the carrier and the semiconductor layer sequence. The entire metal mirror is preferably arranged such that it is completely located between the semiconductor layer sequence and the carrier. The metal mirror is designed to reflect radiation to be emitted or to be received by the active layer. A metal mirror means that the mirror predominantly or completely consists of a metal or a metal alloy. The metal mirror is, for example, a silver mirror. An electrical connection between the carrier and the semiconductor layer sequence may be effected via the preferably electrically conductive metal mirror. The metal mirror may be in direct contact with the semiconductor layer sequence.

In particular, the metal mirror comprises or consists of a material, such as for example silver, which suffers chemical damage under the influence of oxygen or water. A material of the metal mirror, for example likewise silver, may also have a tendency to migrate, specifically under the influence of moisture and/or electrical voltage.

The carrier and the semiconductor layer sequence may project laterally beyond the metal mirror. The lateral direction is for example a direction which extends parallel along a main direction of extension of the carrier. In particular, both the carrier and the semiconductor layer sequence project beyond the metal mirror in each lateral direction. In other words, both the carrier and the semiconductor layer sequence preferably laterally overhang the metal mirror right around or on all sides.

The metal mirror may immediately be laterally surrounded by an encapsulation layer which is transmissive to radiation to be emitted or to be received by the semiconductor layer sequence and is electrically insulating or electrically conductive. In other words, a material of the encapsulation layer directly adjoins, in particular right around, a material of the metal mirror, for example on all the boundary faces of the metal mirror which do not face the carrier or the semiconductor layer sequence.

The optoelectronic semiconductor component may include a carrier and at least one semiconductor layer sequence. The semiconductor layer sequence comprises at least one active layer. The semiconductor layer sequence is furthermore mounted on the carrier. The semiconductor component furthermore includes a metal mirror which is located between the carrier and the semiconductor layer sequence. The carrier and the semiconductor layer sequence project laterally beyond the metal mirror. The metal mirror is moreover immediately laterally, surrounded by an encapsulation layer which is radiation-transmissive and electrically insulating or electrically conductive.

Because the metal mirror is surrounded laterally, in particular completely, by the encapsulation layer, such that none of the boundary face of the metal mirror facing towards the semiconductor layer sequence or the carrier is uncovered, the metal mirror may be protected from damage, for example by oxidation. Migration of constituents of the metal mirror, for example onto lateral boundary faces of the semiconductor layer sequence, may also be prevented or greatly reduced by the encapsulation layer. Outcoupling efficiency of radiation generated for example in the semiconductor component may be increased by using a radiation-transmissive encapsulation layer, since the encapsulation layer absorbs substantially no radiation and since the radiation may in particular be efficiently reflected and deflected by further layers located beneath the encapsulation layer.

According to at least one embodiment of the optoelectronic semiconductor component, the material of the encapsulation layer exhibits a specific diffusion constant for water and/or oxygen of at most $10^{-5}$ g/(m$^2$·d). The specific diffusion constant is here in particular calculated for a material thickness of 0.1 μm. The diffusion constant preferably amounts to at most $5\times10^{-6}$ g/(m$^2$·d), in particular at most $10^{-6}$ g/(m$^2$·d). Thanks to such an encapsulation layer material, a small encapsulation layer thickness may be selected. Such an encapsulation layer material may furthermore ensure that, within the service life of the semiconductor layer sequence, significant corrosion or chemical destruction of the metal mirror may be prevented.

According to at least one embodiment of the optoelectronic semiconductor component, the encapsulation layer comprises or the encapsulation layer consists of a silicon oxide, an aluminium oxide and/or a zirconium oxide. The encapsulation layer may likewise comprise or consist of one of the following materials: $TiO_2$, $HfO_2$, $SnO_2$, SiC, $Zr(SiO_4)$, $Pb_3(Si_2O_7)$, $Na(AlSiO_4)$, $Si_3N_4$, AlN, GaN. Other transparent, moisture-stable oxides, carbides and/or nitrides may also be used for the encapsulation layer.

The metal mirror may have a thickness of 100 nm to 200 nm, in particular 100 nm to 150 nm.

The thickness of the encapsulation layer may be 20 nm to 100 nm, in particular 35 nm to 70 nm. The thickness of the encapsulation layer should here in particular be measured in a direction parallel to a direction of growth of the encapsulation layer. If the encapsulation layer comprises a plurality of coalesced subzones, the thickness should in particular be determined in each case for the individual subzones, for example up to a seam at which the individual subzones adjoin one another.

The optoelectronic semiconductor component may comprise a second mirror layer located between the metal mirror and the carrier. The second mirror layer here preferably immediately adjoins the metal mirror such that a material of the second mirror layer is in physical contact with a material of the metal mirror. The second mirror layer is preferably electrically conductive and for example likewise formed from at least one metal. A material of the second mirror layer is for example Cr or a Cr alloy. Further possible materials for the second mirror layer are Ti, $Ti_3N_4$, TiW, TiW(N), Au, Pt, Pd and/or Ni. The material of the second mirror layer preferably has no or at least a less marked tendency to migration and corrosion under the influence of moisture and/or oxygen than does the material of the encapsulation layer.

The second mirror layer projects laterally beyond the metal mirror, preferably right around. The second mirror layer preferably likewise projects laterally beyond the encapsulation layer, in particular right around.

The second mirror layer is designed in particular to reflect electromagnetic radiation generated in the active layer and transmitted through the encapsulation layer. In other words, the radiation impinging on the encapsulation layer is at least in part specifically transmitted by the encapsulation layer, reflected by the second mirror layer and for example directed towards a radiation passage face of the semiconductor layer sequence. The radiation passage face is for example a boundary face of the semiconductor layer sequence remote from the carrier.

The optoelectronic semiconductor component may emit a predominant part of the radiation, for example more than 50% or more than 80%, at the radiation passage face remote from the carrier. In other words, a main emission direction of the radiation generated in the semiconductor component may be oriented perpendicularly to a plane extending through main directions of extension of the active layer, thus in particular perpendicularly to one side of the carrier substrate onto which the semiconductor layer sequence is applied, or parallel to a direction of growth of the semiconductor layer sequence.

The encapsulation layer may be U-shaped in cross-section. The legs of the U preferably point away from the metal mirror, i.e. an open side of the U is remote from the metal mirror. In other words, the encapsulation layer forms a kind of channel, in particular in the zone in which the semiconductor layer sequence and the carrier project laterally beyond the metal mirror. This means that the encapsulation layer lies against the zones of the semiconductor layer sequence and the carrier or the second mirror layer or a solder joint layer which overhang the metal mirror and against the lateral boundary faces of the metal mirror, wherein in the overhanging zone a cavity is bounded by the encapsulation layer in directions perpendicular to the lateral direction.

The encapsulation layer may comprise a sequence of individual layers, wherein at least two of the individual layers include materials which differ from one another. For example, the encapsulation layer comprises an alternating sequence of individual layers of at least two different materials. The encapsulation layer preferably comprises at least four individual layers, preferably at least eight individual layers, in particular at least twelve individual layers.

The thickness of the individual layers in each case may be 2 nm to 8 nm, in particular 3 nm to 6 nm.

The lateral overhang of the semiconductor layer sequence over the metal mirror may be 50 nm to 2.0 μm. The lateral overhang is preferably 100 nm to 1.0 μm, in particular 100 nm to 500 nm.

The encapsulation layer may be transparent. At most 3.0%, preferably at most 2.0% of visible radiation passing through the encapsulation layer is absorbed. In other words, the encapsulation layer exhibits elevated transparency. This is preferably the case for those spectral ranges in which the semiconductor layer sequence generates electromagnetic radiation during operation of the semiconductor component.

The ratio of one face of the metal mirror to one face of the semiconductor layer sequence, seen in plan view of the semiconductor component, is at least 95%, preferably at least 97%, in particular at least 98.5%. In other words, substantially the entire side of semiconductor layer sequence facing the carrier is covered by the metal mirror.

According to at least one embodiment of the optoelectronic semiconductor component, the radiation passage face of the semiconductor layer sequence is not covered by the encapsulation layer.

A radiation passage face of the semiconductor layer sequence may be covered by the encapsulation layer. For example, the radiation passage face is completely covered by the encapsulation layer, alone or together with an electrical contact point on the radiation passage face. An encapsulation layer material is then preferably $SiO_2$.

The encapsulation layer may partially or preferably completely covers all the lateral boundary faces of the metal mirror, a boundary face, facing the carrier and projecting beyond the metal mirror, of the semiconductor layer sequence, flanks of the semiconductor layer sequence and a boundary face, facing the semiconductor layer sequence and covered thereby in plan view of the radiation passage face, of the carrier, of the second mirror layer and/or of a solder joint layer.

A method for producing an inorganic optoelectronic semiconductor component is furthermore stated. For example, the method may be used to produce a semiconductor component as described in relation to one or more of the above-stated configuration. Features of the optoelectronic semiconductor component are therefore also disclosed for the method described herein and vice versa.

At least one example of the method for producing the inorganic optoelectronic semiconductor component comprises the steps of:
  providing a carrier, a semiconductor layer sequence and a metal mirror, the metal mirror being located between the carrier and the semiconductor layer sequence and being laterally overhung by the latter,
  applying a radiation-transmissive, electrically insulating or electrically conductive encapsulation layer in the lateral direction directly to the metal mirror, wherein the encapsulation layer is produced by means of atomic layer deposition, and
  completing the optoelectronic semiconductor component.

The semiconductor layer sequence is produced, for example, by epitaxial growth on a growth substrate. The carrier preferably differs from the growth substrate.

The encapsulation layer may be produced by atomic layer deposition in a manner similar to that stated in U.S. Pat. No. 4,058,430 A, the subject matter of which is hereby incorporated by reference.

Because the encapsulation layer is produced by atomic layer deposition (ALD), it is possible to produce a particularly uniform layer which comprises only comparatively little contamination and few defects and is therefore particularly diffusion-resistant.

The protective layer may be applied by vapor deposition onto all or parts of the encapsulation layer, in particular onto those boundary faces of the encapsulation layer which do not adjoin the carrier, the semiconductor layer sequence, the second mirror layer and/or a solder joint layer. The vapor deposition may be Chemical Vapor Deposition (CVD) or Physical Vapor Deposition (PVD).

The protective layer may be produced with a thickness of 100 nm to 500 nm. Thanks to the protective layer, the encapsulation layer may in particular be protected from mechanical stresses and damage or also from chemicals which are reactive towards a material of the encapsulation layer.

The semiconductor layer sequence and the metal mirror may be patterned by the same mask and in particular by etching. A mask is applied onto the semiconductor layer sequence, for example by a photolithographic method. Flanks of the semiconductor layer sequence, namely lateral boundary faces of the semiconductor layer sequence, are then produced. Without removing the mask, the metal mirror is then patterned in a subsequent second etch step which in particular differs from the first etch step, wherein an overhang of the semiconductor layer sequence in the lateral direction over the metal mirror may be achieved and adjusted. Because both patterning processes are carried out with the same mask, it is possible to ensure a high level of accuracy in adjusting the shape of the semiconductor layer sequence relative to the shape of the metal mirror.

An optoelectronic semiconductor component described herein and a method described herein will be explained in greater detail below with reference to the drawings and with the aid of representative examples. Elements which are the same in the individual figures are indicated with the same reference numerals. The relationships between the elements are not shown to scale, however, but rather individual elements may be shown exaggeratedly large to assist in understanding.

FIG. 1A illustrates an example of an optoelectronic semiconductor component 1 as a sectional representation. The semiconductor component 1 comprises a semiconductor layer sequence 3 with an active layer 30. A radiation passage face 35 of the semiconductor layer sequence 3 comprises roughening for improving outcoupling of light from the semiconductor layer sequence 3.

The active layer 30 of the semiconductor layer sequence 3 is, for example, designed to emit ultraviolet, near infrared or visible radiation, in particular blue light, when the semiconductor component 1 is in operation. The semiconductor layer sequence 3 may be based on GaN, InGaN, AlGaN, GaP, InGaAlP, InGaAs or GaAs.

A metal mirror 4 is located on the side of the semiconductor layer sequence 3 remote from the radiation passage face 35. The metal mirror 4 is for example a silver mirror and is in direct contact with the semiconductor layer sequence 3.

The semiconductor component 1 furthermore comprises a carrier 2. The carrier 2 includes a carrier substrate 23, which is made for example from a metal, from ceramics or from silicon or germanium. Solder joint layers 22a, 22b adjoin the carrier substrate 23 in a direction towards the semiconductor layer sequence 3. At least one of the solder joint layers 22a, 22b is included with the carrier 2 and applied onto the carrier substrate 23. The solder joint layer 22a may in particular be produced on and/or applied to the semiconductor layer sequence 3. A metal layer 24 is furthermore located on the side of the carrier substrate 23 remote from the semiconductor layer sequence 3. By the metal layer 24, the semiconductor component 1 may be soldered for example by surface mounting to an external mounting support (not shown).

An encapsulation interlayer 21 is furthermore located between the solder joint layer 22a and the semiconductor layer sequence 3. Migration of constituents, for example of the solder joint layers 22a, 22b, into the semiconductor layer sequence 3 may be suppressed by the encapsulation interlayer 21. The encapsulation interlayer 21 comprises or consists of TiWN, for example. A second mirror layer 6, which is electrically conductive and for example formed from chromium, is furthermore located between the metal mirror 4 and the encapsulation interlayer 21.

Both the carrier 2 and the semiconductor layer sequence 3 project beyond the metal mirror 4 in a lateral direction, preferably right around. In other words, the semiconductor layer sequence 3 and the carrier 2 overhang the sides of the metal mirror 4. An encapsulation layer 5 is located on lateral boundary faces of the metal mirror 4, on the upper side, facing the semiconductor layer sequence 3, of the second mirror layer 6, which is not covered by the metal mirror 4, optionally on flanks 32 of the semiconductor layer sequence 3, which constitute lateral boundary faces of the semiconductor layer sequence 3, and on the underside of the semiconductor layer sequence 3, which underside is not covered by the metal mirror 4 and faces the carrier substrate 23. The encapsulation layer 5 is produced by an atomic layer deposition method and is preferably electrically insulating.

The material of the encapsulation layer 5 preferably has a low refractive index to reflect a large proportion of the radiation which impinges on the encapsulation layer 5 by total reflection. A low refractive index may mean that the refractive index or the average refractive index of the encapsulation layer 5 amounts to at most 1.7, preferably to at most 1.6. In particular, the average refractive index of the encapsulation layer 5 is at least 35% lower than an average refractive index of the semiconductor layer sequence 3.

The constituents of the semiconductor component may, individually or in combination, be formed as stated below. The thickness of the semiconductor layer sequence 3 preferably is 3 μm to 15 μm, in particular 4 μm to 6 μm. The metal mirror 4 preferably has a thickness of 100 nm to 150 nm. According to FIG. 1, the thickness of the encapsulation layer 5 amounts to less than half the thickness of the metal mirror 4 such that a channel 7 is formed by the encapsulation layer 5 in the zone in which the semiconductor layer sequence 3 and the carrier 2 laterally project beyond the metal mirror 4. The encapsulation layer 5 is then preferably of a thickness of 30 nm to 70 nm.

The thickness of the second mirror layer 6 is preferably 50 nm to 250 nm. The thickness of the encapsulation interlayer 21 is for example 200 nm to 1.5 μm. Taken together, the solder joint layers 22a, 22b have, for example, a thickness of 1 μm to 6 μm and are in particular formed with or consist of Au, Zn, Ni and/or In. The carrier substrate 23 preferably has a thickness of 50 μm to 500 μm, in particular 75 μn to 200 μm. The metallic contact layers 24, which for example consist of Au or an Au alloy, have for example a thickness of 50 nm to 300 nm.

The semiconductor component 1 may be produced as follows: the semiconductor layer sequence 3 is grown, for example epitaxially, on a growth substrate (not shown). The metal mirror 4 and the second mirror layer 6 are moreover for example printed, applied by vapor deposition or by an electrodeposition method on the side of the semiconductor layer sequence 3 remote from the growth substrate. The encapsulation interlayer 21 is furthermore applied onto the second mirror layer 6 and the solder joint layer 22a is in turn produced on the encapsulation interlayer.

The carrier 2 is furthermore provided with the solder joint layer 22b, the carrier substrate 23 and the metallic contact layer 24. Before or also after detachment of the semiconductor layer sequence 3 from the growth substrate (not shown), the solder joint layers 22a, 22b are soldered to one another, whereby the carrier 2 is firmly connected to the semiconductor layer sequence 3. The carrier 2 may likewise be applied to the semiconductor layer sequence 3 by electrodeposition.

In particular, once the growth substrate has been removed from the semiconductor layer sequence 3, a mask (not shown), for example in the form of a photoresist, is applied to the semiconductor layer sequence 3. The flanks 32 of the semiconductor layer sequence 3 are then produced for example by etching and the lateral extent of the semiconductor layer sequence 3 is patterned. Without removing the mask (not shown), the metal mirror 4 is then preferably patterned by another etching method and the lateral dimensions thereof are determined. The overhang of the semiconductor layer sequence 3 over the metal mirror 4 is produced by this patterning. The semiconductor layer sequence and the metal mirror 4 are thus preferably patterned by the same mask in successive etching steps. For example, once the mask (not shown) has been removed, the patterning on the radiation passage face 35 may then be produced.

The encapsulation layer 5 is produced by atomic layer deposition before or indeed after production of the patterning on the radiation passage face 35. The radiation passage face 35 here preferably remains uncovered by the encapsulation layer 5. The encapsulation layer 5 comprises one or more individual layers (not shown) comprising or made from silicon dioxide and/or aluminium oxide, wherein the layers in each case preferably have a thickness of 2 nm to 8 nm and the total thickness of the encapsulation layer 5 is preferably 30 nm to 70 nm. Individual layers of $SiO_2$ and $Al_2O_3$ are for example arranged alternately.

The lateral overhang L of the semiconductor layer sequence 3 over the metal mirror 4 is preferably 100 nm to 5 μm. The lateral overhang L is preferably less than 1 μm or less than 0.5 μm. Such small overhangs L may be obtained by patterning the semiconductor layer sequence 3 and the metal mirror 4 by the same mask (not shown) such that the metal mirror and the semiconductor layer sequence 3 are accurately patterned relative to one another.

The encapsulation layer 5 is furthermore preferably transparent and does not absorb or only negligibly absorbs the electromagnetic radiation generated for example in the semiconductor layer sequence 3. If the active layer is designed to generate radiation, a proportion of the radiation generated in the active layer 30 may pass with little loss through the encapsulation layer 5 and be reflected back at the second mirror layer 6, for example towards the radiation passage face 35. This increases the outcoupling efficiency of the radiation from the semiconductor component 1.

Figure 1B:
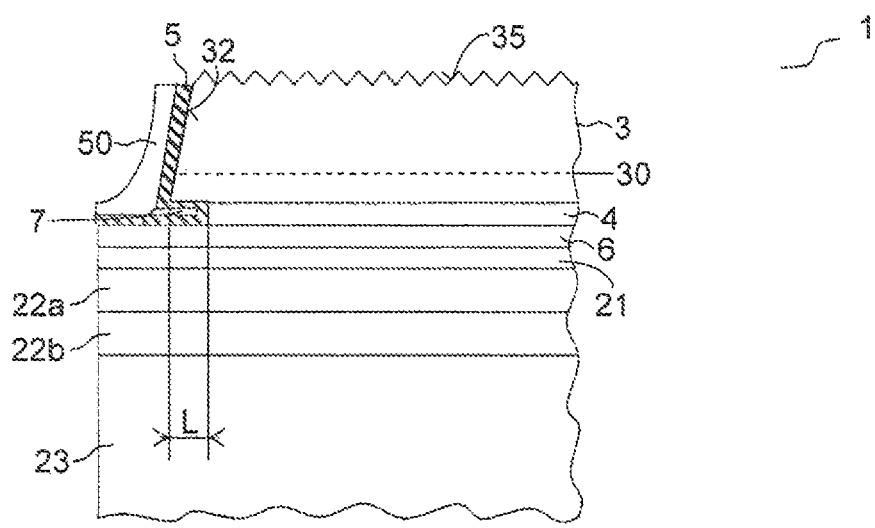

FIG. 1B shows a detail view of the encapsulation layer 5. In the example according to FIG. 1B, a protective layer 50 is additionally applied to the encapsulation layer 5. The thickness of the protective layer 50 is for example 100 nm to 400 nm.

In contrast to the encapsulation layer 5 produced by atomic layer deposition (ALD), the protective layer 50 is produced for example by CVD or PVD. In contrast to ALD, by which the encapsulation layer 5 is produced, CVD or PVD is as a rule not capable of completely filling the channel 7 with material. As a consequence, a cavity remains in the zone in which the semiconductor layer sequence 3 and the carrier 2 laterally overhang the metal mirror 4, which cavity is enclosed by the encapsulation layer 5 and the protective layer 50.

Furthermore, the encapsulation layer 5 prepared by ALD and the protective layer 50 produced by CVD or PVD differ in that the defect density in the ALD encapsulation layer 5 typically amounts to fewer than 0.1 defects per square millimeter, whereas the CVD or PVD protective layer 50 has a defect density of several 100 defects per square millimeter. This may be detected, for example, by transmission electron microscopy (TEM). Due to the comparatively lower defect density of the ALD encapsulation layer 5, the etching rate is also reduced in comparison with the CVD or PVD protective layer 50. This is in particular the case if the encapsulation layer 5 and the protective layer 50 consist of or comprise aluminium oxide. For example, it is possible to determine from the defect density and/or the etching rate which of the layers 5, 50 was produced by which method.

Figure 2:
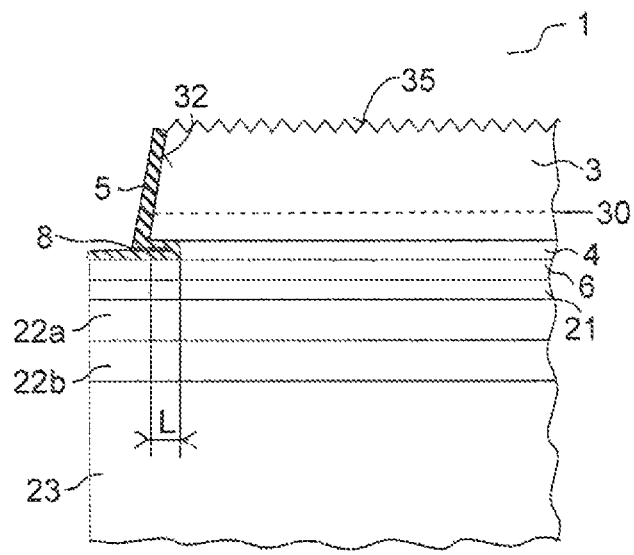

In the example according to FIG. 2 the encapsulation layer 5 has grown so thick by ALD that a sublayer which has grown out from the semiconductor layer sequence 3 and a sublayer which has grown out from the second mirror layer 6, of the encapsulation layer 5 have come into contact and form a seam 8. Particularly efficient encapsulation of the metal mirror 4 relative to oxygen and/or water is ensured as a consequence.

Figure 3:
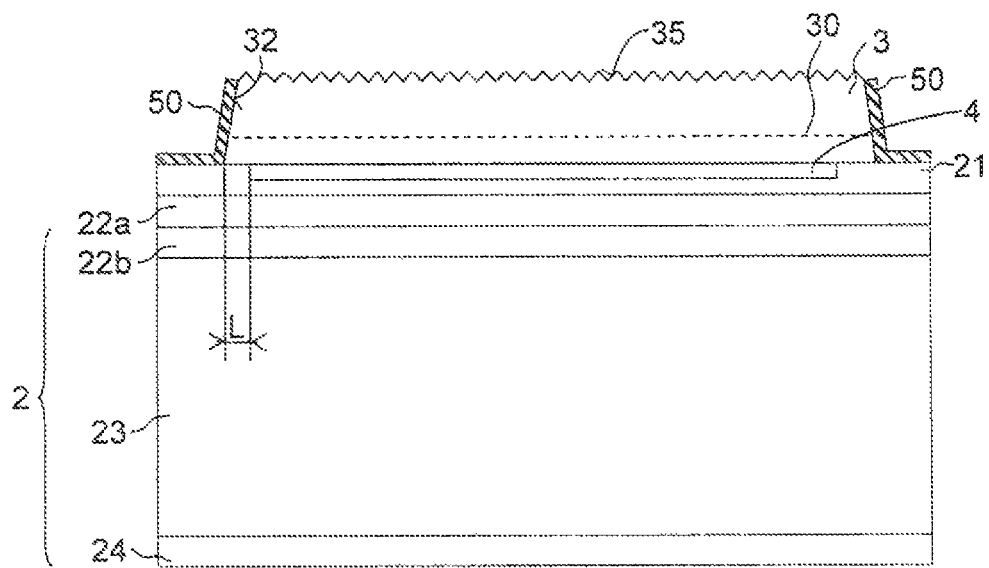
FIG. 3 is a schematic sectional representation of a modification of an optoelectronic semiconductor component.

FIG. 3 shows a sectional representation of a modification of a semiconductor component. In this conventional structure, the metal mirror 4 is also surrounded by the encapsulation interlayer 21 in the lateral direction. If the encapsulation interlayer 21 consists, for example, of TiWN, which is of a black or brownish color, any radiation generated for instance in the semiconductor layer sequence 3 will be strongly absorbed at the encapsulation interlayer 21 and will not be coupled out from the semiconductor component. If a lateral extent of the semiconductor layer sequence 3 is in the range of a few hundred micrometers and the lateral overhang L is in the range of a few micrometers, the encapsulation interlayer 21 will absorb a proportion of the radiation generated in the active layer 30 of an order of magnitude of several percent. The efficiency of a semiconductor component 1, for instance according to FIG. 1 or 2, may be increased approximately by this proportion relative to the component according to FIG. 3.

Figure 4:
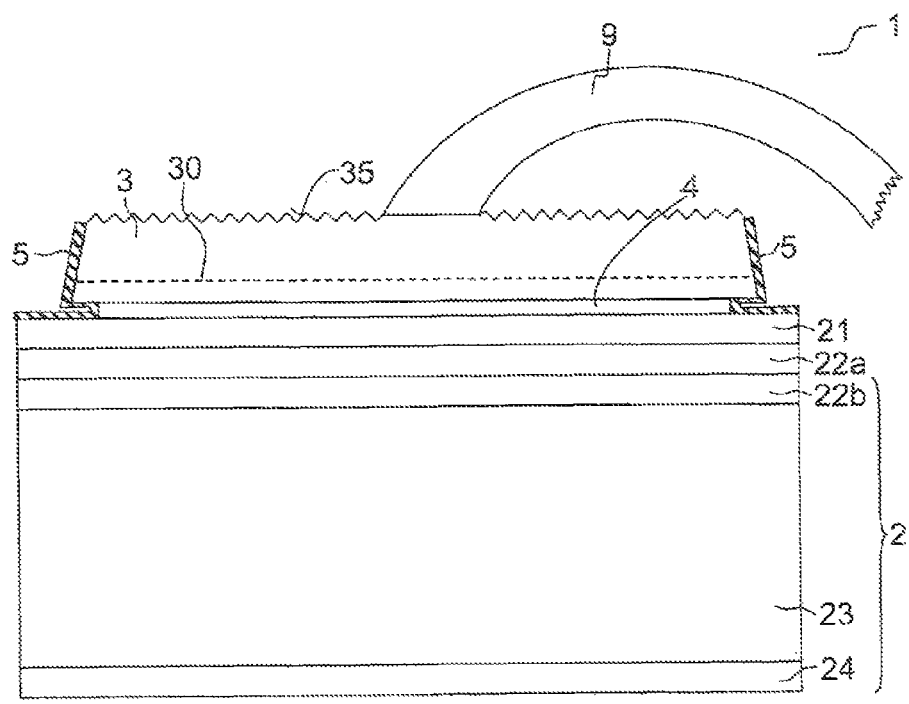

According to the example of FIG. 4, a bonding wire 9 is mounted on the radiation passage face 35. The semiconductor component 1 may thus then be supplied with current via the metallic contact layer 24 and via the bonding wire 9.

Figure 5:
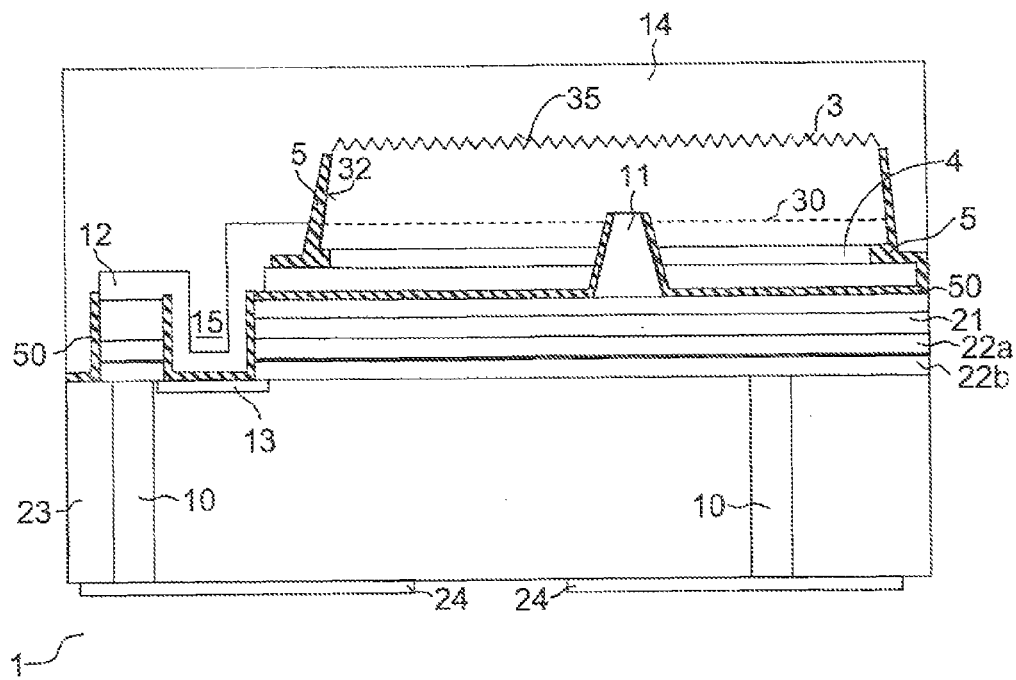

In the example according to FIG. 5, the semiconductor component 1 comprises two metallic contact layers 24, which are in each case guided through electrical vias 10 to the side of the carrier substrate 23 facing the semiconductor layer sequence 3. The side of the semiconductor layer sequence 3 facing the carrier substrate 23 is furthermore electrically contacted via the electrical bridge 12, which bridges a recess 15 in the solder joint layers 22a, 22b and in the encapsulation interlayer 21. The side of the semiconductor layer sequence remote from the carrier substrate 23 is electrically connected via an aperture 11, which is for example filled with copper. The encapsulation layer 5 is embodied as is for example explained in FIG. 1B or 2.

As in all the other examples, the semiconductor layer sequence 3 may be surrounded by a potting compound 14. At least one conversion medium, at least one diffusion medium and/or at least one filter medium may be added to the potting compound 14. An electrical functional element 13, for example taking the form of a device providing protection from electrostatic discharges, may optionally be integrated into the carrier substrate 23, as indeed in the other examples.

Figure 6:
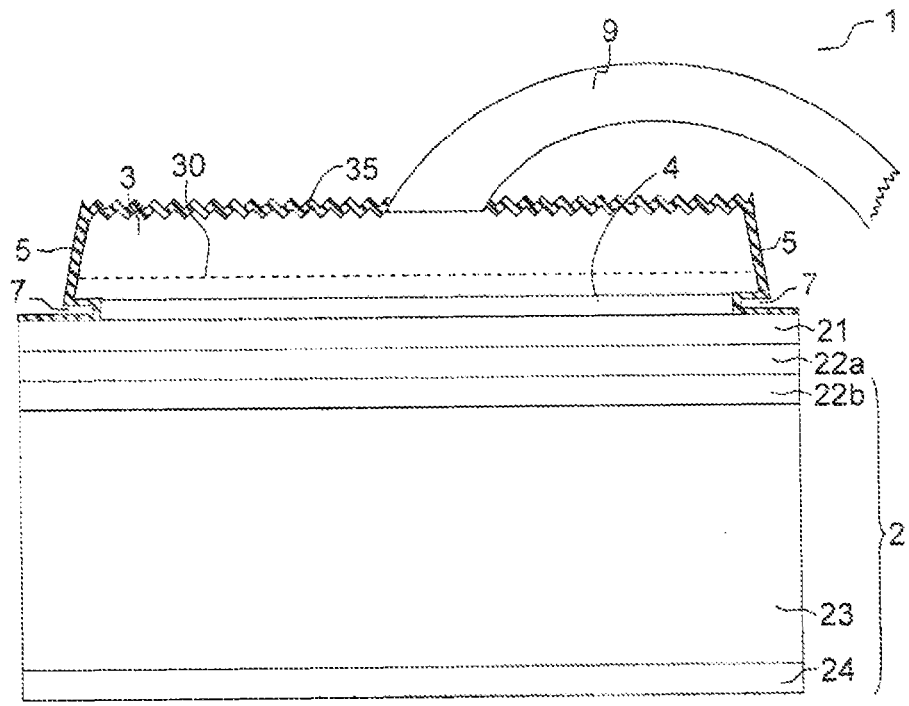

According to FIG. 6, the encapsulation layer 5 completely or virtually completely covers the radiation passage face 35, in particular with the exception of an optionally present connection zone for the bonding wire 9. In such a development, the encapsulation layer 5 consists of a material which is transparent to at least part of the radiation generated in the semiconductor layer sequence 3 or includes such a material. For example, the encapsulation layer 5 then comprises or consists of silicon dioxide, wherein the silicon dioxide may be doped. Doping is in particular performed with aluminium with a dopant concentration of preferably at most 1000 ppm or of at most 100 ppm, wherein ppm denotes parts per million.

Figure 7:
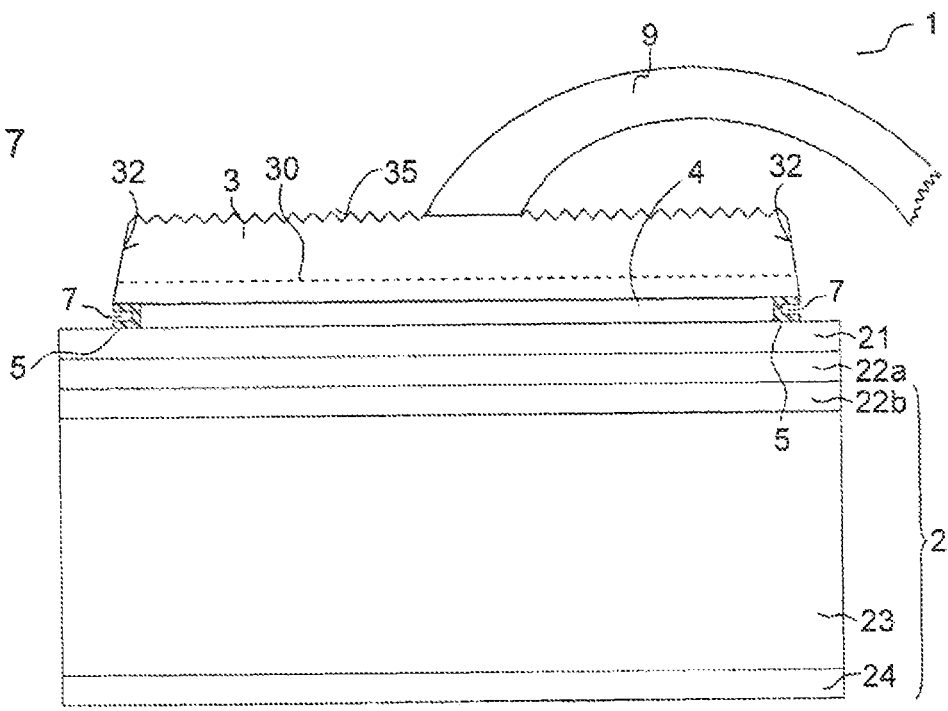

In the example according to FIG. 7, the encapsulation layer 5 extends exclusively or substantially over the channel 7. At variance with the illustration in FIG. 7, it is likewise possible for the encapsulation layer 5 also to extend in part onto the flanks 32 of the semiconductor layer sequence 3, wherein the encapsulation layer 5 does not then however reach the active layer 30 or, in a direction away from the carrier substrate 23, does not extend beyond it. Parts of the encapsulation interlayer 21 located outside the channel 7 may likewise also be covered by the encapsulation layer 5.

In particular in such a development of the encapsulation layer 5 it is possible to use electrically conductive materials for the encapsulation layer 5. For example, the encapsulation layer 5 consists of one of the following materials or comprises one or more of these materials: a transparent conductive oxide such as indium-tin oxide, a pure metal such as tungsten.

Such an encapsulation layer 5, as shown in FIG. 7, may be produced by applying a material for the encapsulation layer 5 first in particular onto the entire semiconductor layer sequence 3, in a similar manner as in the example according to FIG. 6, and subsequently removing the material in places.

The components and methods described herein are not restricted by the description given with reference to the examples. Rather, this disclosure encompasses any novel feature and any combination of features, including in particular any combination of features in the appended claims, even if the feature or the combination is not itself explicitly indicated in the claims or examples.

The invention claimed is:

1. An optoelectronic semiconductor component comprising:
    a carrier,
    at least one semiconductor layer sequence mounted on the carrier and having at least one active layer that generates radiation, and
    a metal mirror located between the carrier and the semiconductor layer sequence,
    wherein the carrier and the semiconductor layer sequence project beyond the metal mirror in a lateral direction and the metal mirror is laterally completely surrounded by an encapsulation layer that directly adjoins the metal mirror and the semiconductor layer sequence on an underside of the semiconductor layer sequence which underside is not covered by the metal mirror and faces the carrier substrate,
    wherein the encapsulation layer is formed by atom layer deposition, at the metal mirror the encapsulation layer is formed in a U shape when seen in cross section and legs of the U shape point away from the metal mirror.

2. The optoelectronic semiconductor component according to claim 1, further comprising a second mirror layer located between the metal mirror and the carrier and which projects laterally beyond the semiconductor layer sequence, wherein the second mirror layer reflects radiation generated in the active layer and transmitted through the encapsulation layer.

3. The optoelectronic semiconductor component according to claim 2, wherein the thickness of the encapsulation layer is 30 nm to 70 nm and a defect density of the encapsulation layer is at most 0.1 defects per square millimeter, wherein the encapsulation layer is electrically insulating and radiation-transmissive and completely covers:
    all lateral boundary faces of the metal mirror,
    a boundary face, facing the carrier and projecting beyond the metal mirror, of the semiconductor layer sequence,
    flanks of the semiconductor layer sequence and
    a boundary face of the carrier, of the second mirror layer and/or of a solder joint layer said boundary face faces the semiconductor layer sequence and is covered thereby seen in plan view onto the radiation passage face.

4. The optoelectronic semiconductor component according to claim 1, wherein the encapsulation layer comprises or consists of at least one of indium-tin oxide, tungsten, $SiO_2$, $Al_2O_3$ and $ZrO_2$.

5. The optoelectronic semiconductor component according to claim 3, wherein a material comprising the encapsulation layer exhibits a specific diffusion constant for water and oxygen of at most $10^{-5}$ g/(m$^2$·d), calculated for a material thickness of 0.1 µm.

6. The optoelectronic semiconductor component according to claim 1, wherein the metal mirror has a thickness of 100 nm to 200 nm and the thickness of the encapsulation layer is 20 nm to 100 nm.

7. The optoelectronic semiconductor component according to claim 1, wherein the encapsulation layer comprises a sequence of individual layers of at least two different materials, and comprises in total at least four individual layers and thickness of the individual layers is in each case 2 nm to 8 nm.

8. The optoelectronic semiconductor component according to claim 1, wherein a lateral overhang of the semiconductor layer sequence over the metal mirror is 100 nm to 2.0 µm.

9. The optoelectronic semiconductor component according to claim 1, wherein the encapsulation layer is transparent and absorbs at most 3.0% of radiation generated or to be received by the active layer as it passes therethrough.

10. The optoelectronic semiconductor component according to claim 1, wherein a ratio of one face of the metal mirror to one face of the semiconductor layer sequence is at least 95%.

11. The optoelectronic semiconductor component according to claim 1, wherein a radiation passage face of the semiconductor layer sequence is free of the encapsulation layer.

12. A method of producing the optoelectronic semiconductor component according to claim 1 comprising:
provoding a carrier, a semiconductor layer sequence and a metal mirror located between the carrier and the semiconductor layer sequence and laterally overhung by the metal mirror, and
applying by atomic layer deposition an encapsulation layer in a lateral direction on the metal mirror.

13. The method according to claim 12, wherein a protective layer with a thickness of 100 nm to 500 nm is applied by vapor deposition on the encapsulation layer.

14. The method according to claim 12, wherein providing the carrier, the semiconductor layer sequence and the metal mirror is done before applying the encapsulation layer.

15. The method of claim 12, wherein the semiconductor layer sequence and the metal mirror are patterned by the same mask and by etching.

16. An optoelectronic semiconductor component comprising:
a carrier,
at least one semiconductor layer sequence mounted on the carrier and having at least one active layer that generates radiation,
an electrically insulating and radiation-transmissive encapsulation layer,
a protection layer, and
a metal mirror between the carrier and the semiconductor layer sequence,
wherein the carrier and the semiconductor layer sequence project beyond the metal mirror in a lateral direction and the metal mirror is laterally completely surrounded by the encapsulation layer that directly adjoins the metal mirror and the semiconductor layer sequence on an underside of the semiconductor layer sequence which underside is not covered by the metal mirror and faces the carrier substrate,
wherein the encapsulation layer is produced by atomic layer deposition and has a thickness of 20 nm to 100 nm.
the protective layer is in direct contact with the encapsulation layer and has a thickness or 100 nm to 500 nm, and
the encapsulation layer, alone or together with an optional connection zone for a bonding wire completely cover flanks of the semiconductor layer sequence and a radiation passage face of the semiconductor layer sequence.

17. The optoelectronic semiconductor component according to claim 16, wherein the encapsulation layer and the protective layer comprise the same material.

* * * * *

UNITED STATES PATENT AND TRADEMARK OFFICE
CERTIFICATE OF CORRECTION

PATENT NO. : 8,698,178 B2  Page 1 of 1
APPLICATION NO. : 13/318800
DATED : April 15, 2014
INVENTOR(S) : Höppel et al.

It is certified that error appears in the above-identified patent and that said Letters Patent is hereby corrected as shown below:

In the Claims

In Column 10

Claim 1, at line 43, please change "by atom layer" to -- by atomic layer --.

Signed and Sealed this
Twenty-ninth Day of July, 2014

Michelle K. Lee
*Deputy Director of the United States Patent and Trademark Office*